Feb. 9, 1971 B. H. CRANSTON ET AL 3,562,009

METHOD OF PROVIDING ELECTRICALLY CONDUCTIVE SUBTRATE THROUGH-HOLES

Filed Feb. 14, 1967

INVENTORS B. H. CRANSTON
R. A. WYDRO, SR.

BY Marn & Jangarathis
ATTORNEYS

United States Patent Office 3,562,009

Patented Feb. 9, 1971

3,562,009

METHOD OF PROVIDING ELECTRICALLY CONDUCTIVE SUBSTRATE THROUGH-HOLES

Benjamin Howell Cranston and Richard Allen Wydro, Sr., Trenton, N.J., assignors to Western Electric Company, Incorporated, New York, N.Y., a corporation of New York Filed Feb. 14, 1967, Ser. N. 615,968
Int. Cl. H05k *1/04;* C23c *11/00*
U.S. Cl. 117—227 2 Claims

ABSTRACT OF THE DISCLOSURE

This disclosure teaches specifically the method of metallizing a substrate or dielectric through-hole by directing a laser beam or an electron beam on a supply of metal to vaporize the metal and vapor deposit the metal on the walls of the substrate through-hole. This disclosure also teaches the method of drilling a substrate through-hole with a laser beam or an electron beam and metallizing the through-hole as stated above. Further, this disclosure teaches the method of metallizing a substrate through-hole by placing a supply of metal over a substrate through-hole and engaging the metal supply with a laser beam or an electron beam to melt the supply and flow of melted supply through the through-hole. In addition, the present disclosure teaches the method of metallizing a substrate through-hole by filling the through-hole with metal granules, and engaging the granules with a laser beam or an electron beam to vaporize the granules and vapor deposit the metal on the walls of the through-hole.

BACKGROUND OF THE INVENTION

Field of the invention

This invention relates generally to methods of providing a deposition on the surface of an object. More specifically, this invention relates to methods of metallizing a substrate through-hole with a vapor deposited metal deposition, and also, to methods of drilling a substrate through-hole with a laser beam or electron beam and metallizing the beam drilled through-hole utilizing the immediately foregoing stated methods of metal vapor deposition.

It is well known that the coating art is replete with instances wherein it is desired or required than an inaccessible or irregular surface be coated with some material. For example, in the printed circuit and integrated circuitry art, there continually exists the need for providing electrical conducting paths, such as metallized through-holes, to electrically interconnect various circuit elements or components, and to provide electrically conductive receptacles for receiving the leads of discrete electrical components. More specifically, in the micro-miniature circuit art wherein thin film components and circuits are deposited on both sides of a substrate or dielectric material, there is ever present the need for providing electrical interconnections between the circuits or components located on opposite sides of the substrate or dielectric material; such circuit arrangement being commonly referred to as double-sided substrates.

Description of the prior art

In the prior art, electrical interconnections between circuits or components located on opposite sides of such double-sided substrates, have been provided in various ways. For example, such electrical interconnections have been provided by electrically conductive pins which are driven through the double-sided substrates at appropriate locations. This technique, however, has not proven to be entirely satisfactory since it subjects the thin film circuitry and substrate to unwanted, and at times ruinous, mechanical shock.

Another prior art method is the electroless plating of pre-formed through-holes. This method includes the well known separate steps of hole drilling, screening or masking, immersion in a suitable solution and plating, rinsing, and drying. While this method can provide highly satisfactory electrical interconnections, or metallized through-holes, the method lends itself to batch processing and is not readily useful in selectively providing a single metallized through-hole, particularly, after the circuit board has once been through a complete manufacturing process. Further, in the electroless plating method, there is a relatively severe substrate through-hole diameter (or diameter to length ratio) limitation, in that the typical inks or coating fluids employed will only penetrate or pass through substrate through-holes which are relatively large in diameter, or which have a relatively large diameter to length ratio.

Other methods of mechanically providing electrical interconnections between circuits or components located on opposite sides of a substrate, are also known to the prior art, and while such other methods can provide highly satisfactory electrical interconnections, they typically have the requirement of special tooling, which requirement can be, in some instances, undesirable or disadvantageous.

SUMMARY

The methods of the present invention provide highly efficient and satisfactory methods of coating inaccessible and irregularly shaped surfaces, such as for example, the wall of a through-hole in a double-sided substrate, which walls, due to the requirement that the through-hole be of extremely small diameter, are quite inaccessible. Such methods include the steps of providing a supply of vaporizable metal adjacent the surface to be coated, and engaging the vaporizable metal with a laser beam or an electron beam to vaporize the metal and deposit the metal on the surface.

More specifically, the present invention provides methods of drilling a through-hole in a double-sided substrate and coating the walls of the drilled through-hole with a metallic deposition, which methods include the steps of positioning a supply of metal adjacent the dielectric material on one side thereof, directing a laser beam or an electron beam against the substrate on the opposite side thereof and bombarding said substrate with the laser beam or electron beam to drill a hole therethrough, and passing the laser beam or electron beam through the beam drilled hole to strike and vaporize the metal to provide a metal vapor backstream to coat the walls of the drilled hole with a metal deposition.

Unlike the previously mentioned prior art methods of providing metallized through-holes, the methods of the present invention require no special tooling; readily provide variable sized metallized through-holes by varying the diameter, or sweep diameter, of the laser beam or electron beam; and provide variable control over the thickness of the deposition, and hence variable control over the deposition conductivity or resistivity, such as, by varying the distance between the metal supply and the through-hole to be metallized, by varying the diameter, or sweep diameter, of the laser beam or electron beam, by varying the intensity of the laser beam or electron beam, or by varying other parameters as taught in detail infra.

Certain methods of the present invention also provide a deposited land area, if desired, surrounding the metallized through-hole, which land area is useful in providing a relatively large area for making electrical interconnections.

Further, this invention teaches methods of metallizing a substrate through-hole by placing a supply of metal over a substrate through-hole, and engaging the metal supply with a laser beam or electron beam to melt the supply and flow the metal supply through the through-hole.

In addition, the present invention provides methods of metallizing the walls of a substrate through-hole by filling the through-hole with granules of a vaporizable metal, and engaging the granules with a laser beam or electron beam to vaporize the granules and vapor deposit the metal on the walls of the through-hole.

DETAILED DESCRIPTION

Figure 1:
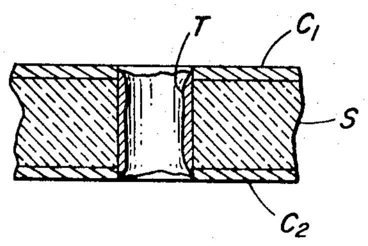
FIG. 1 is a diagrammatic representation illustrating a metallized substrate through-hole, and referred to in providing a background for the present invention.

Referring now to FIG. 1, there is shown a substrate or dielectric material S having thin film circuits, or components, $C_1$ and $C_2$, deposited on the opposite surfaces thereof. In the manner known in the art, $C_1$ and $C_2$ can be electrically interconnected by a metallized through-hole, indicated generally at T; the through-hole T, as is well known, being a hole formed through $C_1$, S, and $C_2$, and the walls of which have been metallized to electrically interconnect $C_1$ and $C_2$.

Figure 2:
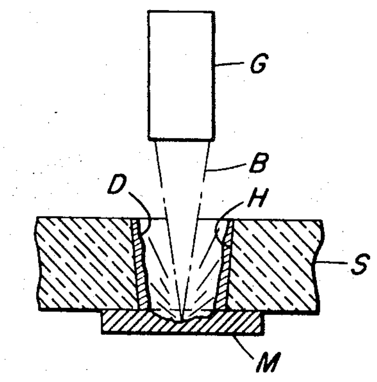
FIGS. 2 through 6 are diagrammatic representations referred to in describing the various method embodiments of the present invention, the method, or methods, illustrated by each figure being described in detail infra.

Referring now to FIG. 2, metallized through-holes can be provided in accordance with certain methods of the present invention, by positioning a supply of vaporizable and electrically conductive metal M adjacent (contiguous or in actual contact in this embodiment) a substrate S having a hole H suitably formed therein, and by engaging the metal supply M with laser beam or electron beam B, from a suitable beam source G, to vaporize and vapor deposit the metal D on the walls of the hole H. Thus, the deposition D provides an electrically conductive path between opposite surfaces of the substrate S.

Figure 3:
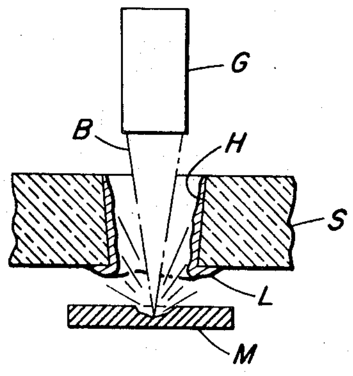

If desired or required, metallized through-holes having a surrounding land area can be provided by certain methods of the present invention, as illustrated diagrammatically in FIG. 3. In this embodiment, and as illustrated in FIG. 3, a supply of vaporozable and electrically conductive metal M is positioned adjacent (spaced apart in this embodiment) a substrate S having a hole H suitably formed therein, and by engaging the metal supply M with a laser beam or electron beam B from a suitable beam source G, to vaporize and vapor deposit the metal D on the walls of the hole H, and on the bottom surface of the substrate S to provide the surrounding deposited land area L; which land area L can be useful for the purposes set forth above. The area of the deposited land area L is a function, inter alia, of the spacing between the substrate S and the metal supply M.

The thickness of the depositions D and L are related to the amount of metal M vaporized; and the amount of vaporization for a given material, is related to the intensity of the laser beam or electron beam B, the duration of engagement of the beam B with the metal supply M, and the diameter, or sweep diameter of the beam; and the vaporization characteristics of the metal itself.

It will be noted that as illustrated in FIGS. 2 and 3, the beam B passes through the substrate hole H, engages and vaporizes the metal M, and creates a metal vapor backstream to vapor deposit the metal and coat the walls of the hole H. However, it will be understood by those skilled in the art, that it is not necessary to pass the beam through the substrate hole H, and that the beam B could be direced into engagement with the metal M, not through the hole H, but from another angle to engage and vaporize the metal M and practice the methods of the present invention.

Figure 4:
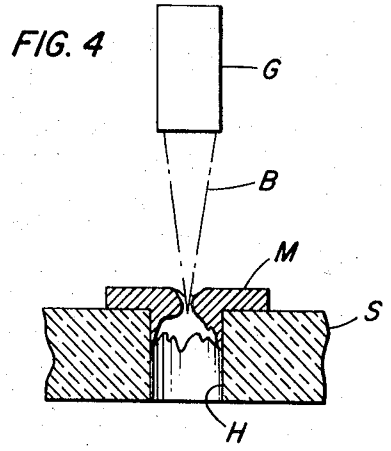

Another embodiment of the present invention is illustrated in FIG. 4 wherein there is shown a substrate S having a hole H suitably formed therein. A supply of electrically conductive metal M is placed over the hole H and the metal M is engaged with a laser beam or electron beam B to melt the metal and flow the melted metal through the hole, and thereby, coat the walls of the hole with electrically conductive metal.

Figure 5:
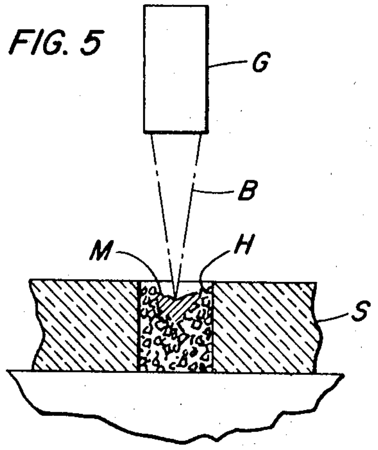

The diagrammatic representation of FIG. 5 illustrates another embodiment of the present invention. In this embodiment, the bottom of a hole H suitably formed in the substrate S is suitably closed by some member as shown, and the hole is filled with granules of electrically conductive metal. The granules are engaged by a laser beam or electron beam B to vaporize the granules and deposit the metal on the walls of the hole H.

Certain other methods of the present invention can be practiced to form a hole in a substrate and, concurrently, practice certain of the previously described methods to coat the walls of hole with electrically conductive metal.

Figure 6:
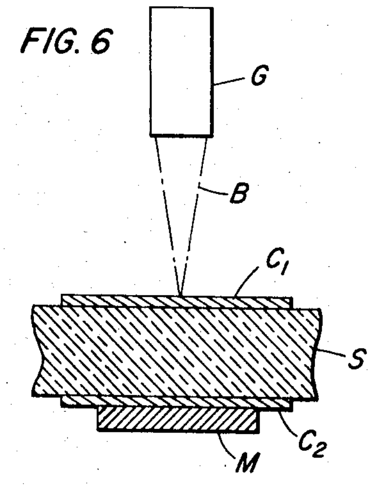

More specifically, as illustrated in FIG. 6, a supply of electrically conductive metal M is positioned adjacent one side of a double-sided substrate S having thin film circuits or components $C_1$ and $C_2$ deposited on the oppossite sides thereof, and a laser beam or electron beam B is focused against the double-sided substrate, on the opposite side thereof, to form or drill (thermally machine) a hole through $C_1$, S, and $C_2$, and engage the supply of electrically conductive metal M, and coat the walls of the hole with the electrically conductive metal, (in accordance with the method set forth above and illustrated in FIG. 2) to electrically interconnect the thin film circuits $C_1$ and $C_2$. Should it be further desired or required to provide the land area L of FIG. 3, the metal supply M would then be moved (by suitable means) a predetermined distance away from the substrate S, as shown in FIG. 3, and the land area L would then be vapor deposited in the manner taught above. Certain methods of the present invention also include the step of initially positioning a supply of electrically conductive metal M a predetermined distance from one side of a double-sided substrate S, and then beam drilling a hole through the double-sided substrate, and vapor depositing a coating on the walls of the beam drilled hole and a land area L.

In the practice of certain methods of the present invention, laser beams and pulsed thermal electron beams were used to drill (thermally machine) a hole through a dielectric material comprising alumina ceramic, and to engage and vaporize a supply of vaporizable and electrically conductive metal, which metal in various embodiments included: aluminum, copper and stainless steel.

More specifically, in the practice of certain methods of the present invention, a laser beam was employed to drill (thermally machine by bombarding with photons) a substrate of alumina ceramic .025″ in thickness to holes. Laser beam parameters found to be effective utilizing a Westinghouse 12J laser and a Xenon flashlamp, were:

Energy to flashlamp: 1100 joules

Crystal: ⅜″ diameter x 6″ long, ruby with 85% reflective coating on the output end, clear on opposite end, with a 99% reflective mirror mounted 6″ from the clear end.

Pulse length: approx. 1.4 mil. sec.

Output energy: approx. 1.0 joule.

Optics: 10× lens, focal length approx. 16 mm., a piece of .010″ thick steel shim stock having a ⅛″ diameter aperture, was placed in alignment with the laser cavity between the 10× lens and the output end of the ruby crystal.

After the initial pulse, the lens defocused approx. .0012 mil. towards the alumina ceramic substrate. Total of 10 pulses were used to create a .001 diameter hole and deposite the material located beneath the substrate (FIG. 2) on the walls of the hole. The same laser parameters were found to be effective for FIGS. 4 and 5.

Further, in the practice of certain method embodiments of the present invention, a pulsed thermal electron beam .001″ in diameter, was used and swept in a circular path to drill (thermally machine by bombarding with electrons) holes, varying from .003″ in diameter to .015″ in diameter, in substrates of alumina ceramic .038″ in thickness. The evaporating metal used to provide the vapor depositions were metallic foils of copper, aluminum and stainless steel, varying from .010″ to .035″ in thickness. In the practice of the method embodiments wherein the deposited land area L (FIG. 3) was provided, the vaporizable metal was spaced .125″ from the substrate. Electron beam parameters found to be effective in thermally machining the alumina ceramic substrate and for vaporizing the vaporizable metal, are:

accelerating voltage—135 kv.
beam current—approx. 1.0 ma.
vacuum—$5\times10^{-4}$ torr
pulse width—15 sec.
repetition rate—1,000 c.p.s.
circular sweep rate—60 c.p.s.

Various metallized substrate through-holes, provided by the above-described methods, were cross-sectioned and microphotographs were taken. The vapor depositions coated completely and adhered tenaciously to the walls of the thermally machined holes, and could not be readily removed mechanically. Further, since (as is well known) the electron beam generation requires an evacuated atmosphere, such vacuum conditions provide an ideal environment for the vapor deposition of metals, by substantially eliminating metal oxidation.

It will be understood by those skilled in the art, that depending upon the composition and thickness of the dielectric material or substrate involved, the thickness of the vapor depositions desired or required, the vapor deposition rate to be employed, and the composition and positioning (contiguous to or spaced predetremined distances from the substrates) of the vaporizing metal employed, the high energy beam parameters will be varied accordingly. It has been found, however, that the beam parameters must be related primarily to the thermal stress properties of the substrate or dielectric material. It has been further found, that the thickness of the evaporating metal, when placed contiguous to the substrate, serve as a heat sink while the substrate is being drilled, and hence, permit more power to be utilized without thermal stressing of the substrate.

Although alumina ceramic substrates were employed in the above-described specific method embodiments, the present invention is applicable for practice with many other substrate or dielectric materials, in particular those susceptible to thermal machining.

It will be further appreciated by those skilled in the art, that since with appropriate high energy beam programming (provided by programmed electromagnetic deflection systems and lens focusing systems) that the methods of the present invention could be employed in integrated circuit, thin film circuit and printed circuit board production, to perform welding operations to secure components, provide metallized through-holes for electrical interconnections, deposit a circuit pattern, and provide other circuit vapor depositions.

What is claimed is.

1. The method of coating the walls of a through-hole formed in a substrate with a vaporizable metal to provide an electrical interconnection between a first and a second surface of the substrate, comprising:
- filling the through-hole with granules of vaporizable metal, and
- engaging said granules with an electron beam to vaporize said granules and vapor deposit said metal on the walls of said through-hole, to form said electrical inter-connection.

2. The method of coating the walls of a through-hole formed in a substrate with a vaporizable metal, to provide an electrical inter-connection between a first and a second surface of the substrate, comprising:
- filling the through-hole with granules of vaporizable metal; and
- engaging said granules with a laser beam to vaporize said granules and vapor deposit said metal on the walls of said through-hole, to form said electrical connection.

References Cited

UNITED STATES PATENTS

| | | | |
|---|---|---|---|
| 3,265,855 | 8/1966 | Norton | 219—121 |
| 3,436,468 | 4/1969 | Haberecht | 117—212X |

FOREIGN PATENTS

| | | |
|---|---|---|
| 1,468,426 | 12/1966 | France. |

ALFRED L. LEAVITT, Primary Examiner

A. GRIMALDI, Assistant Examiner

U.S. Cl. X.R.

117—22, 93.3 95, 98, 107, 212; 219—121